United States Patent
Van Duivenbode et al.

(10) Patent No.: US 11,016,402 B2
(45) Date of Patent: May 25, 2021

(54) PARTICLE REMOVAL APPARATUS AND ASSOCIATED SYSTEM

(71) Applicants: Jeroen Van Duivenbode, Veldhoven (NL); Petrus Jacobus Maria Van Gils, Berkel-Enschot (NL); Petrus Johannes Van Den Oever, Eindhoven (NL); Coen Hubertus Matheus Baltis, Eindhoven (NL)

(72) Inventors: Jeroen Van Duivenbode, Veldhoven (NL); Petrus Jacobus Maria Van Gils, Berkel-Enschot (NL); Petrus Johannes Van Den Oever, Eindhoven (NL); Coen Hubertus Matheus Baltis, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 5 days.

(21) Appl. No.: 16/698,905

(22) Filed: Nov. 27, 2019

(65) Prior Publication Data

US 2020/0096881 A1 Mar. 26, 2020

Related U.S. Application Data (63) Continuation of application No. PCT/EP2018/055283, filed on Mar. 5, 2018.

(30) Foreign Application Priority Data

Jun. 1, 2017 (EP) .................................... 17173872
Jul. 24, 2017 (EP) .................................... 17182807

(51) Int. Cl.
*G03F 7/20* (2006.01)
*B08B 6/00* (2006.01)

(52) U.S. Cl.
CPC ............ *G03F 7/70925* (2013.01); *B08B 6/00* (2013.01); *G03F 7/70033* (2013.01)

(58) Field of Classification Search
CPC ............. H01L 21/6833; H01L 21/6831; H01L 21/67028; H01L 21/67742; G03F 7/70925;
(Continued)

(56) References Cited

U.S. PATENT DOCUMENTS

| 4,744,833 A | * | 5/1988 | Cooper | ..................... B08B 6/00 134/1 |
| 5,507,874 A | * | 4/1996 | Su | ......................... B08B 7/0035 134/1 |

(Continued)

FOREIGN PATENT DOCUMENTS

| JP | H08167643 A | 6/1996 |
| JP | 2006 013308 A | 1/2006 |

OTHER PUBLICATIONS

PCT Notification of Transmittal of the International Search Report and the Written Opinion of the International Searching Authority dated Jun. 22, 2018, in corresponding PCT International Application No. PCT/EP2018/055283 (11 pgs.).

(Continued)

*Primary Examiner* — David A Vanore
(74) *Attorney, Agent, or Firm* — Finnegan, Henderson, Farabow, Garrett & Dunner, LLP (57) ABSTRACT

An apparatus for removing particles from a clamp, the apparatus being arrangeable in proximity of the clamp and comprising an insulating portion, a supporting portion, at least a part or all of the insulating portion being arranged on the supporting portion, wherein the supporting portion is configured such that when a voltage is applied to the supporting portion of the apparatus and/or to an electrode of the clamp, the supporting portion acts as an electrode to
(Continued)

allow an electric field to be generated between the apparatus and the clamp for removal of the particles from the clamp.

35 Claims, 5 Drawing Sheets

(58) Field of Classification Search
CPC .. G03F 7/707; G03F 7/70708; G03F 7/70916; B08B 6/00; B08B 1/001; B08B 7/00; H01J 2237/2007; H01J 37/20; H01J 2237/022; H01J 37/32862
USPC ............... 250/440.11, 431, 492.21; 361/225; 279/128
See application file for complete search history.

(56) References Cited

U.S. PATENT DOCUMENTS

| | | | | |
|---|---|---|---|---|
| 5,671,119 | A * | 9/1997 | Huang | B08B 1/00 361/234 |
| 5,746,928 | A * | 5/1998 | Yen | H01J 37/32862 134/1.1 |
| 5,946,184 | A * | 8/1999 | Kanno | H01L 21/6833 361/234 |
| 7,583,491 | B2 * | 9/2009 | Peitzsch | H01L 21/67011 361/234 |
| 8,514,544 | B2 * | 8/2013 | McAnn | H01L 21/6833 361/234 |
| 8,585,112 | B2 * | 11/2013 | Kawakami | H01J 37/20 294/119.1 |
| 8,592,786 | B2 * | 11/2013 | Suuronen | H01J 37/20 250/492.21 |
| 9,312,163 | B2 * | 4/2016 | Tanaka | H01L 21/6833 |
| 10,459,353 | B2 * | 10/2019 | Chien | G03F 7/70741 |
| 10,896,828 | B2 * | 1/2021 | Humphrey | C23C 16/0227 |
| 2001/0029112 | A1 * | 10/2001 | Toyoda | H01J 37/32357 438/785 |
| 2005/0195382 | A1 * | 9/2005 | Ottens | G03F 7/70783 355/72 |
| 2006/0162739 | A1 * | 7/2006 | Sogard | B08B 7/0014 134/1 |
| 2008/0073564 | A1 * | 3/2008 | Mun | H01J 37/3171 250/441.11 |
| 2010/0258144 | A1 * | 10/2010 | Broz | B08B 1/001 134/6 |
| 2011/0149462 | A1 * | 6/2011 | Kugimoto | H01L 21/6831 361/234 |
| 2012/0017938 | A1 * | 1/2012 | Weaver | H01L 21/67046 134/6 |
| 2012/0024318 | A1 * | 2/2012 | Itoh | B05D 5/00 134/6 |
| 2013/0201597 | A1 * | 8/2013 | Ishikawa | B32B 5/142 361/234 |
| 2013/0255407 | A1 * | 10/2013 | Chilese | G03F 1/84 73/865.8 |
| 2015/0165492 | A1 * | 6/2015 | Avoyan | B08B 17/04 134/1 |
| 2017/0131643 | A1 * | 5/2017 | Janssen | H01L 21/6831 |
| 2017/0205717 | A1 * | 7/2017 | Van Der Wilk | H01L 21/67028 |
| 2018/0190527 | A1 * | 7/2018 | Watanabe | H01L 21/6831 |
| 2019/0201945 | A1 * | 7/2019 | Tokashiki | B08B 7/0071 |
| 2019/0348315 | A1 * | 11/2019 | Tanikawa | H01L 21/6831 |
| 2020/0058536 | A1 * | 2/2020 | Yang | B08B 13/00 |
| 2020/0096881 | A1 * | 3/2020 | Van Duivenbode | B08B 6/00 |
| 2020/0348599 | A1 * | 11/2020 | Bai | G03F 7/70066 |
| 2020/0348606 | A1 * | 11/2020 | Perez-Falcon | G03F 7/70708 |
| 2020/0384509 | A1 * | 12/2020 | Azaria | B08B 6/00 |

OTHER PUBLICATIONS

Kenneth Mason "Research disclosure" Jan. 1, 2011 p. 11, XP007140193, ISSN: 0374-4353 the whole document.
Anonymous "Method for Cleaning an Electrostatic Chuck" Feb. 3, 2005, ip.com Journal, ip.com Inc. West Henrietta, NY. US. XP013023111, ISSN:1533-0001 the whole document.

* cited by examiner

PARTICLE REMOVAL APPARATUS AND ASSOCIATED SYSTEM

CROSS-REFERENCE TO RELATED APPLICATIONS

This application claims priority to International Application No. PCT/EP2018/055283, filed on Mar. 5, 2018, and published as WO 2018/219509 A1, which claims priority of EP application no. 17173872.7, which was filed on 1 Jun. 2017 and EP application no. 17182807.2, which was filed on 24 Jul. 2017. The contents of these applications are each incorporated herein by reference in their entireties.

FIELD

The embodiments of the present disclosure relate to an apparatus for removing particles from a clamp and associated system and method. The embodiments of the present disclosure relate, for example, to an apparatus for removing particles from a clamp of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

An electrostatic clamp may be used in the lithographic apparatus to electrostatically clamp (or hold) an object, such as for example a mask or a substrate to an object support, such as for example a support structure or a substrate table, respectively.

Particles that may be present on the object may move onto a surface of the electrostatic clamp, where the particles may cause so-called sticking effects between the electrostatic clamp and the object. These sticking effects may, for example, impact an overlay control of the lithographic apparatus.

The particles may be manually removed from the surface of the electrostatic clamp, for example by wiping the surface of the electrostatic clamp with a cleaning product. However, this may impact the availability of the lithographic apparatus, as particles may be removed during downtime of the lithographic apparatus and the manual removal of the particles may be time extensive.

SUMMARY

According to some embodiments of the present disclosure, an apparatus is provided for removing particles from a clamp, the apparatus being arranged or arrangeable in proximity of the clamp and comprising an insulating portion; and a supporting portion, at least a part or all of the insulating portion being arranged on the supporting portion, wherein the supporting portion is configured such that when a voltage is applied to the supporting portion of the apparatus and/or to an electrode of the clamp, the supporting portion acts as an electrode to allow an electric field to be generated between the apparatus and the clamp for removal of the particles from the clamp.

Removal of particles from the clamp may reduce or prevent sticking-effects between the clamp and an object held by the clamp. For example, when the apparatus is used with or comprised in a lithographic apparatus, the removal of the particles from the clamp may results in an improved overlay control of the lithographic apparatus. The use of the apparatus may also avoid manual removal of particles from the clamp. This may lead to an increased availability of the lithographic apparatus, for example as particle may not have to be removed during downtime of the lithographic apparatus. Additionally or alternatively, by providing the apparatus with an insulating portion, particles removed from clamp may be prevented from returning to the clamp.

The apparatus may be configured such that a shape of at least a portion of the apparatus is complementary to a shape of a portion of the clamp, for example to allow a distance between the apparatus and the clamp to be reduced or minimised. By reducing a distance between the apparatus and the clamp, a strength of the electric field may be increased. This may increase, improve or facilitate removal of the particles from the clamp.

The supporting portion may comprise at least one recess or a plurality of recesses.

For example when the supporting portion comprises a plurality of recesses, the insulating portion may extend between at least two adjacent recesses.

The at least one recess or each recess of the plurality of recesses may be shaped such that a support of the clamp may be at least partially receivable in the at least one recess or each recess of the plurality of recesses, for example when the apparatus is moved towards the clamp.

The insulating portion may be shaped or configured such that an inhomogeneous electric field may be generated between the apparatus and the clamp, for example when a voltage is applied to the supporting portion of the apparatus and/or the electrode of the clamp. The generation of an inhomogeneous electric field between the apparatus and the clamp may allow for the removal of particles, such as for example non-charged particles.

The insulating portion may be shaped or configured such that at least a part of an electric field generated between the apparatus and the clamp may be concentrated or increased at one or more points on the insulating portion, for example when a voltage is applied to the supporting portion of the apparatus and/or the electrode of the clamp.

The apparatus may comprise a plurality of insulating portions. Each insulating portion may be arranged to extend or protrude from the supporting portion.

The/each insulating portion may be arranged to taper from a first end to a second end. The first end of the/each insulating portion may be arranged at or on the supporting portion. The second end may be arranged such that, for example in use, the second end is directed towards the clamp, e.g. a surface or upper surface of the clamp.

The second end of the/each insulating portion may comprise a pointed or sharp portion.

A lateral extension or dimension of the apparatus may be selected to correspond, e.g. substantially correspond, to a lateral extension or dimension of the clamp. This may allow for removal of particles from nearly all of the clamp, e.g. a/the surface or upper surface of the clamp.

A lateral extension or dimension of the apparatus may be selected such that the particles are removed or removeable from a pre-determined area or space on the clamp, e.g. a/the surface of the clamp. This may allow particles to be removed locally from the clamp, e.g. a/the surface or supper surface of the clamp.

The apparatus may be configured to be connected or connectable to a controller. The controller may be configured to apply a voltage to the supporting portion of the apparatus and/or the electrode of the clamp.

The supporting portion and/or the insulating portion may be arranged to define a continuous surface.

For example when a voltage is applied to the supporting portion of the apparatus and/or an electrode of the clamp, the voltage may be selected such that the electric field between the apparatus and the clamp extends in a direction opposite to a direction of an electric field generated between the clamp and an object, for example in use, of the clamp.

According to some embodiments of the present disclosure, a system is provided for removing particles from a clamp, the system comprising the apparatus; and a clamp configured to hold an object.

The clamp may be configured for use with a lithographic apparatus or the clamp may be part of or comprised in the lithographic apparatus.

The clamp may be or comprise an electrostatic clamp.

The system may further comprise a controller configured to apply a voltage to the supporting portion of the apparatus and/or an electrode of the clamp. The voltage may be selected such that the electric field generated between the apparatus and the clamp acts on the particles on the clamp, e.g. to cause removal of the particles from the clamp.

According to some embodiments of the present disclosure, a method is provided for removing particles from a clamp, the method comprising arranging an apparatus for removing particles from a clamp in proximity of the clamp, the apparatus comprising an insulating portion and a supporting portion, wherein at least a part or all of the insulating portion is arranged on the supporting portion, wherein the supporting portion is configured such that when a voltage is applied to the supporting portion of the apparatus and/or to an electrode of the clamp, the supporting portion acts as an electrode to allow an electric field to be generated between the apparatus and the clamp for removal of the particles from the clamp; and applying a voltage to the supporting portion of the apparatus and/or an electrode of the clamp to generate an electric field between the apparatus and the clamp for removal of the particles from the clamp.

The voltage may be selected such that the particles adhere to at least a part or all of the insulating portion.

According to some embodiments of the present disclosure, a lithographic apparatus is provided, the lithographic apparatus comprising an illumination system configured to condition a radiation beam; a support structure constructed to support a patterning device, the patterning device being capable of imparting the radiation beam with a pattern in its cross-section to form a patterned radiation beam: a substrate table constructed to hold a substrate, the substrate table comprising a clamp for holding the substrate; a projection system configured to project the patterned radiation beam onto the substrate; and the apparatus for removing particles from the clamp.

According to some embodiments of the present disclosure, a lithographic apparatus is provided, the lithographic apparatus comprising: an illumination system configured to condition a radiation beam; a support structure constructed to support a patterning device, the support structure comprising a clamp for holding the patterning device, the patterning device being capable of imparting the radiation beam with a pattern in its cross-section to form a patterned radiation beam; a substrate table constructed to hold a substrate; a projection system configured to project the patterned radiation beam onto the substrate; and the apparatus for removing particles from the clamp.

According to some embodiments of the present disclosure, an apparatus is provided for removing particles from a substrate table, the apparatus being arrangeable in proximity of the substrate table and comprising: an insulating portion; a supporting portion, at least a part or all of the insulating portion being arranged on the supporting portion, wherein the supporting portion is configured such that when a voltage is applied to the supporting portion of the apparatus and/or to the substrate table, the supporting portion acts as an electrode to allow an electric field to be generated between the apparatus and the substrate table for removal of the particles from the substrate table.

Removal of particles from the substrate table reduces contamination build up. This may avoid a reduction in substrate edge yield and may lead to an increased availability of the lithographic apparatus. Additionally or alternatively, by providing the apparatus with an insulating portion, particles removed from the substrate table may be prevented from returning to the substrate table.

The apparatus may be configured to remove particles from the top surface of burls of the substrate table.

The supporting portion and/or the insulating portion may be arranged to define a continuous surface.

The insulating portion and the supporting portion may have projecting portions in the region of the burls.

The supporting portion may be a conductive plate.

The insulating portion may be a layer of polymer.

The apparatus may be configured to be connected or connectable to a controller. The controller may be configured to apply a voltage to the supporting portion of the apparatus and/or the substrate table.

According to some embodiments of the present disclosure, a system is provided for removing particles from a substrate table, the system comprising the apparatus for removing particles from the substrate table; and the substrate table constructed to hold a substrate.

The substrate table may be configured for use with a lithographic apparatus or the substrate table may be part of or comprised in the lithographic apparatus.

The system may further comprise a controller configured to apply a voltage to the supporting portion of the apparatus and/or the substrate table. The voltage may be selected such that the electric field generated between the apparatus and the substrate table acts on the particles on the substrate table to cause removal of the particles from the substrate table.

According to some embodiments of the present disclosure, a method is provided for removing particles from a substrate table, the method comprising: arranging an apparatus for removing particles from a substrate table in proximity of the substrate table, the apparatus comprising an insulating portion and a supporting portion, wherein at least a part or all of the insulating portion is arranged on the supporting portion, wherein the supporting portion is configured such that when a voltage is applied to the supporting portion of the apparatus and/or to the substrate table, the supporting portion acts as an electrode to allow an electric field to be generated between the apparatus and the substrate table for removal of the particles from the substrate table; and applying a voltage to the supporting portion of the apparatus and/or the substrate table to generate an electric field between the apparatus and the substrate table for removal of the particles from the substrate table.

The voltage may be selected such that the particles adhere to at least a part or all of the insulating portion.

According to some embodiments of the present disclosure, a lithographic apparatus is provided, the lithographic apparatus comprising: an illumination system configured to condition a radiation beam; a support structure constructed to support a patterning device, the patterning device being capable of imparting the radiation beam with a pattern in its cross-section to form a patterned radiation beam; a substrate table constructed to hold a substrate; a projection system configured to project the patterned radiation beam onto the substrate; and the apparatus for removing particles from the substrate table.

Various aspects and features of the disclosed embodiments set out above or below may be combined with various other aspects and features of the embodiments as will be readily apparent to the skilled person.

BRIEF DESCRIPTION OF THE DRAWINGS

Embodiments of the present disclosure will now be described, by way of example only, with reference to the accompanying schematic drawings, in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system". The term "lens" may be used herein as shorthand for "projection lens".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
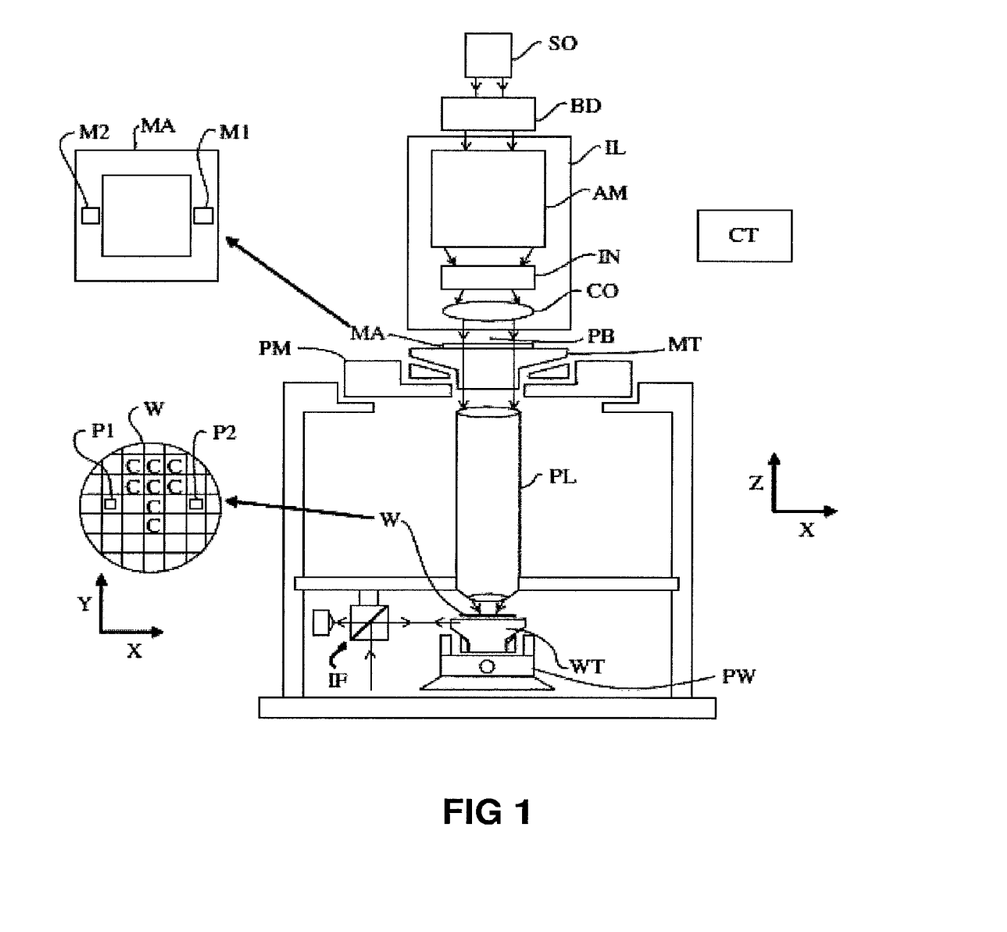
FIG. 1 depicts a lithographic apparatus according to some embodiments of the disclosure.

FIG. 1 schematically depicts a lithographic apparatus according to some embodiments of the disclosure. The apparatus comprises:

an illumination system IL to condition a beam PB of radiation (e.g. UV radiation).

a support structure (e.g. a mask table) MT to support a patterning device (e.g. a mask) MA and connected to first positioning device PM to accurately position the patterning device with respect to item PL;

a substrate table (e.g. a substrate table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may comprise adjusting means AM for adjusting the angular intensity distribution of the beam. The outer and/or inner radial extent (commonly referred to as outer and □-inner, respectively) of the intensity distribution in a pupil plane of the illumination system can be adjusted.

In addition, the illumination system IL generally comprises various other components, such as an integrator IN and a condenser CO. The illumination system provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT can be realized with the aid of a long-stroke module (coarse positioning) and a short-stroke module (fine positioning), which form part of the positioning device PM and PW. Patterning device MA and substrate W may be aligned using patterning device alignment marks M1, M2 and substrate alignment marks P1, P2. In an alternative arrangement (not illustrated) movement of the object tables MT, WT may be controlled by a planar motor and encoder system.

The depicted apparatus may for example be used in a scan mode, in which the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The scanning direction is conventionally referred to as the y-direction of the lithographic apparatus.

It will be appreciated that in other examples the depicted apparatus may be used in in step mode. In step mode, the patterning device (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In yet another example, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to mask-less lithography that utilizes programmable patterning device, such as a programmable mirror array of a type as referred to above.

The lithographic apparatus may comprise a clamp, such as for example an electrostatic clamp, for holding an object. The object may be or comprise the substrate and/or the mask MA. The electrostatic clamp may be part of or comprised in the substrate table WT and/or support structure MT.

Figure 2:
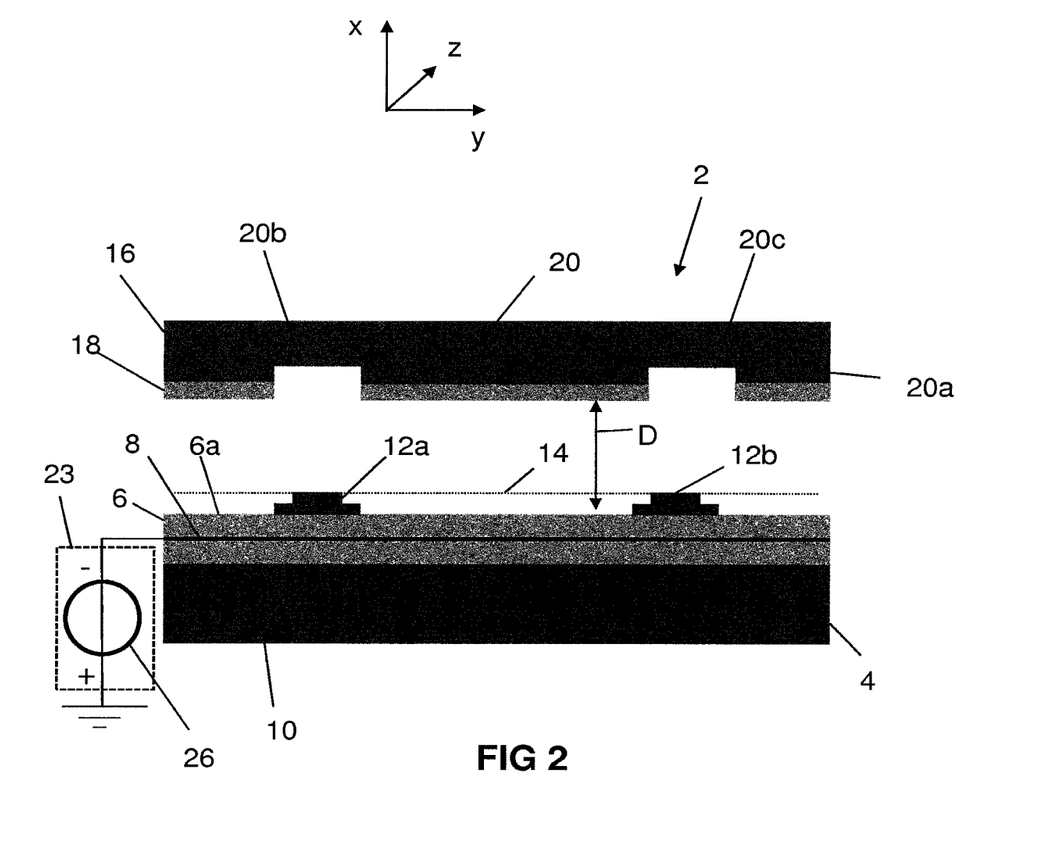
FIG. 2 schematically depicts a system comprising an apparatus for removing particles from a clamp according to some embodiments of the disclosure.

FIG. 2 depicts a system 2 for removing particles from a clamp according to some embodiments of the disclosure. In the example depicted in FIG. 2, the clamp is provided in the form of an electrostatic clamp 4 of a lithographic apparatus. The electrostatic clamp 4 comprises a dielectric portion 6 and an electrode 8, which is surrounded by the dielectric portion 6. The dielectric portion 6 may comprise a dielectric or insulating material and/or may be considered as being non-conductive or insulated. The electrostatic clamp 4 comprises a lower portion 10. The lower portion 10 may be formed of an insulating material. The dielectric portion 6 and the electrode 8 may be arranged on the lower portion 10. The electrostatic clamp 4 may comprise a plurality of supports 12a, 12b, two of which are depicted in FIG. 2, for holding the object, e.g. the mask MA and/or the substrate. It will be appreciated that in other embodiments the clamp may comprise more or less than two supports. The supports 12a, 12b may be provided in the form of burls 12a, 12. The burls 12a, 12b may be arranged on an upper surface 6a of the dielectric portion 6. The burls 12a, 12b may be formed from a dielectric material provided with a conductive coating or a conductive material. The burls 12a, 12b may be connected to ground. Upper surfaces of the burls 12a, 12b may define a plane 14 in which the object can be held.

The electrode 8 of the electrostatic clamp 4 is configured to be held at a voltage to generate an electrostatic force between the electrostatic clamp 4 and the object. In other words, the object may be held in the plane 14 by an electrostatic clamping force when a voltage is applied to the electrode 8. The electrostatic or Coulomb clamping pressure (clamping force per unit) can be related to the applied electric field strength according to the following equation:

$$P = \tfrac{1}{2}\varepsilon_0 E^2 \qquad (1)$$

where P is the Coulomb clamping pressure exerted on the object to be clamped, $\varepsilon_0$ is the vacuum permittivity and E is the electric field strength experienced by the clamped object. In examples, where the dielectric comprises a dielectric material and a vacuum gap, the electric field and dielectric constant may be replaced by terms reflecting the combination of materials and/or media involved. The electric field strength E may be considered as generally proportional to a voltage V applied to the electrode 8 of the electrostatic clamp 4, proportional to the relative permittivity of the dielectric material and/or media and inversely proportional to a thickness of the dielectric material and/or media, e.g. the sum of a thickness of the dielectric material and a thickness of the vacuum gap.

It will be appreciated that the system described herein is not limited to using the exemplary electrostatic clamp depicted in FIG. 2 and that other electrostatic clamps may be used. For example, in other embodiments the electrostatic clamp may be provided in the form of a thin film clamp. A dielectric portion of the thin film clamp may be formed from a dielectric material, such as for example a polymer. Alternatively or additionally, in other embodiments, the dielectric portion may be arranged on an electrode instead of surrounding the electrode or the electrode may comprise one or more portions that are spaced from one another.

FIG. 2 depicts an apparatus for use with the system for removing particles from a clamp. The apparatus may be provided in the form of a cleaning apparatus 16. The cleaning apparatus depicted in FIG. 2 may also be referred to a cleaning substrate. The cleaning apparatus 16 may be suitable for removing particles from the electrostatic clamp 4. For example, due to the voltage applied to the electrode 8, charged particles may be attracted to the object and/or a charge may be induced in particles that may be present on the object. The charged particles may move from the object to the dielectric portion 6 of the electrostatic clamp 4. The charged particles may remain on the dielectric portion 6 of the electrostatic clamp 4, even when the voltage applied to the electrode 8 of the electrostatic clamp 4 has been decreased to 0V.

Particles that are present on the upper surface 6a of dielectric portion 6 of the electrostatic clamp 4 may cause so-called sticking effects between the clamp 4 and the object. The particles may cause a residual charge on upper surface 6a of the dielectric portion 6 of the clamp 4, which may cause the sticking effect. Since the particles are located on the upper surface 6a of the dielectric portion of the electrostatic clamp 4, there are no means for the charge of the particles to be conducted away from the dielectric portion 6.

In examples, where the object comprises a substrate, the sticking effects may impact the arranging or loading of a substrate on the clamp 4. The charged particles on the dielectric portion 6 of the electrostatic clamp 4 may act on the substrate and/or apply a force on the substrate. The force may impact loading/arranging of the substrate on the clamp. For example, the force may impact the overlay control of the lithographic apparatus. The overlay control of the lithographic apparatus may be considered as the control of aligning a projected pattern with an existing pattern on a substrate. Misalignment between the projected pattern and the existing pattern on the substrate may lead to short circuits and/or connection failures in a multi-layer device structure.

In use, the cleaning apparatus 16 may be arranged in proximity of the electrostatic clamp 4. The cleaning apparatus 16 comprises an insulating portion 18. The insulating portion 18 may comprise an insulating or dielectric material, such as for example glass or a polymer. For example the insulating or dielectric material may comprise Silicon Dioxide ($SiO_2$), Silicon Nitride ($Si_3N_4$) or a Benzocyclobutene (BCB)-based polymer. However, it will be appreciated that other insulating or dielectric materials may be used. The cleaning apparatus 16 comprises a supporting portion 20. In FIG. 2, the insulating portion 18 is depicted as being arranged on the supporting portion 20. The insulating portion 18 is arranged to extend or protrude from the supporting portion 20.

The supporting portion 20 is configured such that when a voltage is applied to the supporting portion 20 and/or the electrode 8 of the electrostatic clamp 4, the supporting portion acts as an electrode to allow an electric field to be generated between the cleaning apparatus 16 and the electrostatic clamp 4 for removal of the particles from the electrostatic clamp 4. For example, when a voltage is applied to the electrode 8 of the electrostatic clamp 4, charges in the supporting portion 20 may redistribute in the supporting portion 20 so that a part of the supporting portion 20 has a polarity opposite to a polarity of the voltage applied to the electrode 8 of the electrostatic clamp 4. In other words, the supporting portion 20 may be considered as at least partly or fully polarized. The part of the supporting portion 20 that has the polarity opposite to the polarity of the voltage applied to the electrode 8 of the electrostatic clamp 4 may face or be arranged opposite to the upper surface 6a of the dielectric portion 6 of the electrostatic clamp 4, in use. The part of the supporting portion 20 that has the polarity opposite to the polarity of the voltage applied to the electrode 8 of the electrostatic clamp 4 may be considered as a lower part 20a of the supporting portion 20. The voltage applied to the electrode 8 of the electrostatic clamp 4 may be selected such that the particles adhere to at least a part or all of the insulating portion 18 of the cleaning apparatus 16.

Figure 3A:
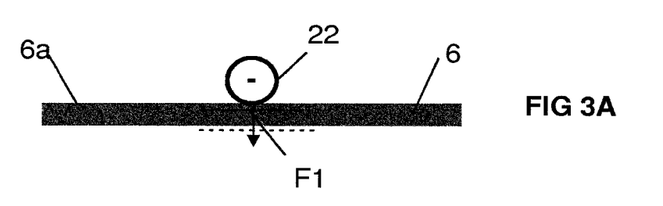
FIG. 3A schematically depicts a particle on a dielectric portion of the clamp of the system of FIG. 2.

FIG. 3A schematically depicts the interaction between a charged particle 22 and the dielectric portion 6 of the electrostatic clamp 4. As described above, the charged particle 22 may move from the object on to the upper surface 6a of the dielectric portion 6 of the electrostatic clamp 4. The charged particle 22 may induce a polarisation to a portion of the dielectric portion 6 of the electrostatic clamp 4. For example, the particle 22 may be negatively charged and induce a positive charge on the upper surface 6a of the dielectric portion 6, as depicted in FIG. 3A. This polarisation may cause the charged particle 22 to adhere to the dielectric portion 6. The adhesion of the charged particle 22 to the dielectric portion 6 of the electrostatic clamp 4 may be due to a first force F1, such as the Van der Waals force, acting between the charged particle 22 and the dielectric portion 6 of the electrostatic clamp 4. A direction of the first force F1 acting between the charged particle 22 and the dielectric portion 6 of the electrostatic clamp 4 is indicated by a solid arrow in FIG. 3A. Although the voltage applied to the electrode 8 of the electrostatic clamp 4 may be 0V, the charged particle 22 may adhere to the dielectric portion 6 of the electrostatic clamp 4, e.g. due to the first force F1.

Figure 3B:
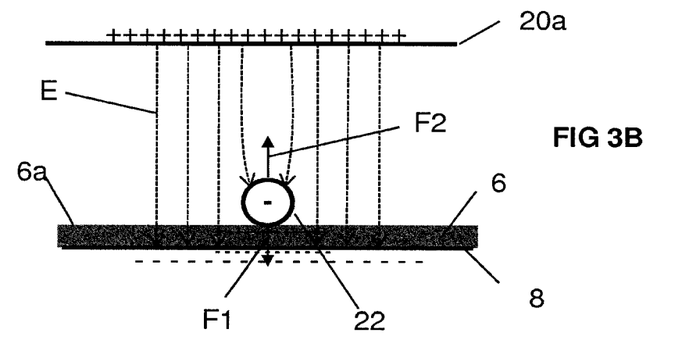
FIGS. 3B and 3C schematically depict an electric field acting on the particle of FIG. 3A, which has generated between the clamp and the apparatus of FIG. 2.

FIG. 3B is similar to FIG. 3A, but additionally depicts the electrode 8 of the electrostatic clamp 4 and the lower part 20a of supporting portion 20 of the cleaning apparatus 16. In the example depicted in FIG. 3B, the electrode 8 of the electrostatic clamp 4 is negatively charged and the lower part 20a of the supporting portion 20 of the cleaning apparatus 16 is considered to be positively charged, e.g. due to charge distribution in the supporting portion 20 caused by a negative voltage applied to the electrode 8 of the electrostatic clamp 4. An electric field E is generated between the cleaning apparatus 16 and the electrostatic clamp 4, which is indicated by dashed arrows. Due to the positive charge of the lower part 20a of the supporting portion 20 of the cleaning apparatus 16 and/or the negatively charged electrode 8 of the electrostatic clamp 4, a second force F2 acts on the charged particle 22 in a direction opposite to the first force F1. The second force F2 may be considered as the Coulomb force, which may be considered to be attractive between the particle 22 and the lower part 20a of the supporting portion and to be repellent between the particle 22 and the electrode 8 of the electrostatic clamp 4. The electric field F indicated in FIG. 3B may be considered as extending in a direction opposite to an electric field that may be present in use of the electrostatic clamp 4, e.g. between the object and the electrostatic clamp 4. As can be seen in FIG. 3B, reversal of the direction of the electrical field may not be sufficient to remove the charged particle 22 from the upper surface 6a of the dielectric portion 6 of the electrostatic clamp 4. An increase of the strength of the electric field E between the cleaning apparatus 16 and the electrostatic clamp 4 may be necessary.

Figure 3C:
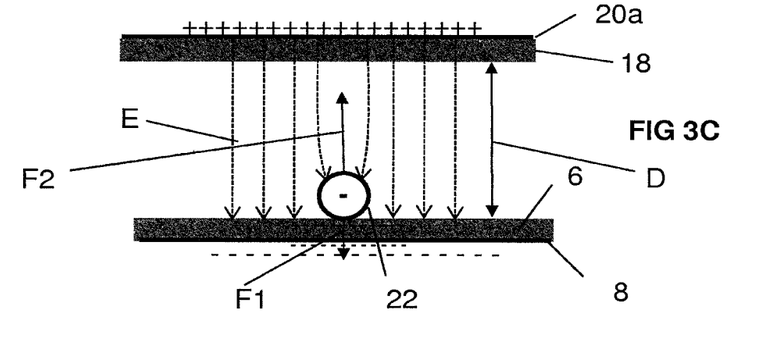

FIG. 3C is similar to FIG. 3B, but additionally depicts the insulating portion 18 of the cleaning apparatus 16. In FIG. 3C, the strength of electric field E can be considered to be increased relative to the electric field depicted in FIG. 3B. For example, the increase in the strength of the electric field may be achieved by increasing the voltage applied to electrode 8 of the electrostatic clamp 4 and/or reducing a distance D between the cleaning apparatus 16 and the electrostatic clamp 4, as will be described below. The increased electric field strength may cause an increase of the second force F2 acting on the charged particle 22, which may cause movement of the charged particle 22 towards the insulating portion 18 of the cleaning apparatus 16.

The strength of the electric field that is required to allow removal of particle from the electrostatic clamp 4 may be dependent on a size of the particle, such as for example a radius of the particle. The strength of the electric field required to remove a particle from the electrostatic clamp 4 may be proportional to $r^{-1/2}$, whereby r is the radius of the particle. In other words, with decreasing particle size, the strength of the electric field is required to be increased to allow for removal of the particle from the electrostatic clamp 4.

For example, the electric field E may comprise a strength that is about 1.5 times of the strength of the electric field generated between the object and the electrostatic clamp 4, in use of the electrostatic clamp 4. For example, the electric field E may comprise a strength of about $1\times10^8$ V/m to $2\times10^8$ V/m, such as for example $1.5\times10^8$ V/m. An electric field comprising a strength of about $1\times10^8$ V/m to $2\times10^8$ V/m, such as for example $1.5\times10^8$ V/m, may be sufficient for removal of particles from the electrostatic clamp 4. An electric field having the exemplary strength described above may be used, for example in vacuum conditions. The voltage applied to the electrode 8 of the electrostatic clamp 4 may be selected such a voltage across a gap between the cleaning apparatus 16 and the electrostatic clamp 4 is about 1000 to 2000V, such as for example 1500V. The voltage across the gap between the electrostatic clamp 4 and the cleaning apparatus 16 may be achieved by applying a voltage that is about 3 times the voltage across the gap between the cleaning apparatus 16 and the electrostatic clamp 4, such as for example 3000V to 6000V, to the electrode 8 of the electrostatic clamp 4. However, it will be appreciated that the voltage that is required to be applied to electrode 8 of the electrostatic clamp 4 to achieve a voltage of about 1000V to 2000V across the gap may depend on the arrangement of the electrostatic clamp 4 and/or the arrangement of the cleaning apparatus 16. For example, the voltage that is required to be applied to electrode 8 of the electrostatic clamp 4 to achieve a voltage of about 1000V to 2000V across the gap may depend on a thickness of the dielectric portion 6 of the electrostatic clamp 4, a thickness of the burls 12a, 12b, the distance D between the electrostatic clamp 4 and the cleaning apparatus 16 and/or a thickness of the insulating portion 18 of the cleaning apparatus 16. The voltage across the gap between the electrostatic clamp 4 and the cleaning apparatus 16 that is required for removal of particle from the electrostatic clamp may dependent on the distance D between the electrostatic clamp 4 and the cleaning apparatus 16. In examples, where the distance D between the electrostatic clamp 4 and the cleaning apparatus 16 is about 10 μm, a voltage of about 1500V may be required across the gap between the electrostatic clamp 4 and the cleaning apparatus 16 to allow for removal of particles from the electrostatic clamp 4. A voltage of about 1500V across the gap between the electrostatic clamp 4 and the cleaning apparatus 16 may result in an electric field having a strength of about $10^8$V/m. In examples, where the distance D between the electrostatic clamp 4 and the cleaning apparatus 16 is about 7 μm, a voltage of about 1000V may be required across the gap between the electrostatic clamp 4 and the cleaning apparatus 16 to allow for removal of particles from the electrostatic clamp 4.

At atmospheric pressure the strength of the electric field E may be reduced compared to the strength of the electric field used in vacuum conditions. For example, air may break down, e.g. an electric discharge or electric arc may be formed according to Paschen's law, in an electric field having a strength of about $4\times10^6$ V/m to $4\times10^7$ V/m. The electric field strength may depend on the distance D between the cleaning apparatus 16 and the electrostatic clamp 4. For example, at a distance D of about 10 μm between the cleaning apparatus 16 and the electrostatic clamp 4, air may break down at a strength of the electric field of about $4\times10^7$ V/m. An electric field having at strength of about or below $4\times10^7$ V/m may be sufficient to remove particles from the electrostatic clamp 4, when the distance D between the cleaning apparatus 16 and the electrostatic clamp 4 is about 10 μm. When the distance D between the cleaning apparatus 16 and the electrostatic clamp 4 is about 1 mm, air may break down at a strength of the electric field of about $4\times10^6$ V/m. At such a distance, an electric field having at strength of about or below $4 \times 10^6$ V/m may be sufficient to remove particles from the electrostatic clamp 4. Particles that may be removed from the electrostatic clamp 4 at atmospheric pressure may be about or larger than at least 1 μm. This may be due to the strength of the electric field required to remove a particle from the electrostatic clamp 4 being proportional to whereby $r^{-1/2}$ is the radius of the particle.

At atmospheric pressure, the voltage applied to the electrode 8 of the electrostatic clamp 4 may be selected such a voltage across a gap between the cleaning apparatus 16 and the electrostatic clamp 4 is about 400 to 4000V. In examples, where the distance D between the electrostatic clamp 4 and the cleaning apparatus 16 is about 10 μm, a voltage of about 400V may be required across the gap between the electrostatic clamp 4 and the cleaning apparatus 16 to allow for removal of particles from the electrostatic clamp 4. In examples, where the distance D between the electrostatic clamp 4 and the cleaning apparatus 16 is about 1 mm, a voltage of about 4000V may be required across the gap between the electrostatic clamp 4 and the cleaning apparatus 16 to allow for removal of particles from the electrostatic clamp 4. It will be appreciated that the exemplary system described herein is not limited to use of the strengths of electric field and/or voltages across the gap described above. For example in other embodiments, the voltage applied to the electrode of the electrostatic clamp may be selected such that the electric field generated between the cleaning apparatus and the electrostatic clamp is sufficient to allow for removal of particle from the electros static clamp.

It will be appreciated that a size or extension of the gap between the cleaning apparatus 16 and the electrostatic clamp 4 may be defined or described by the distance D between the cleaning apparatus 16 and the electrostatic clamp 4

As described above, FIG. 3C additionally depicts the insulating portion 18 of the cleaning apparatus 16. By providing the cleaning apparatus 16 with an insulating portion 18, reversal of the charge of the particle 22, e.g. caused the positive polarity of the lower part 20a of the supporting portion 20, may be prevented. The insulating portion 18 may prevent discharging of the particle 22 captured from the upper surface 6a of the dielectric portion 6 of the electrostatic clamp 4 and/or returning of the captured particle to the upper surface 6a of the dielectric portion 6 of the electrostatic clamp 4.

Although the particle was described above as being negatively charged, it will be appreciated that in other embodiments the particle may be positively charged, for example, due to a negative voltage being applied to the electrode of the electrostatic clamp during use of the electrostatic clamp. Alternatively, the particle may be uncharged. The voltage, e.g. the polarity of the voltage, applied to the electrode 8 of the electrostatic clamp 4 may be selected such that an electric field E generated between the cleaning apparatus 16 and the electrostatic clamp 4 may extend in a direction opposite to an electric field that may be generated in use of the electrostatic clamp 4, e.g. between the object and the electrostatic clamp.

Although in the example of FIG. 2 a voltage is applied to the electrode of the electrostatic clamp, it will be appreciated that in other embodiments a voltage may be applied to the supporting portion of the cleaning apparatus in addition to or instead of the voltage applied to the electrode of the electrostatic clamp. The voltage applied to supporting portion of the cleaning apparatus may be selected in a same manner as the voltage applied to the electrode of the electrostatic clamp.

In the example depicted in FIG. 2, the cleaning apparatus 16 is configured such that a shape of at least a portion of the cleaning apparatus 16 is complementary (or substantially complementary) to a shape of a portion of the electrostatic clamp 4, e.g. to allow the distance D between the cleaning apparatus 16 and the electrostatic clamp 4 to be reduced or minimised. As described above, by reducing the distance D between the cleaning apparatus 16 and the clamp 4, the strength of the electric field extending between the cleaning apparatus 16 and the electrostatic clamp 4 may be increased. The distance D may be reduced to increase the strength of the electric field extending between the cleaning apparatus 16 and the electrostatic clamp 4 in addition to or instead of increasing the voltage applied to, for example, the electrode 8 of the electrostatic clamp 4. For example, the supporting portion 20 may be shaped to be complementary (or substantially complementary) to a shape of the upper surface 6a and/or dielectric portion 6 of the electrostatic clamp 4 to allow the distance D between the cleaning apparatus 16 and the electrostatic clamp 4 to be reduced or minimised. For example, the distance D between the cleaning apparatus 16 and electrostatic clamp may be reduced to about 5 to 20 μm, such as for example 10 μm. It will be appreciated that in other embodiments the distance between the cleaning apparatus and electrostatic clamp may be varied or reduced to be larger or less than 5 to 20 μm. For example, as described above under atmospheric pressure the distance between the cleaning apparatus and the electrostatic clamp may be about 1 mm. The supporting portion 20 may comprise a plurality of recesses 20b, 20c (two of which are depicted in FIG. 2). Although FIG. 2 depicts two recesses 20b, 20c, it will be appreciated that in other embodiments, the electrode may comprise more or less than two recesses. For example, a number of recesses of the electrode may be dependent on a number of burls present on the upper surface of the dielectric portion of the electrostatic clamp.

Each recess 20b, 20c may be shaped such that a respective burl 12a, 12b of the electrostatic clamp 4 is at least partially or fully received in each recess, e.g. when the cleaning apparatus 16 is moved towards the electrostatic clamp 4, e.g. the upper surface 6a of the dielectric portion 6. When the supporting portion 20 is in contact with the burls 12a, 12b of the electrostatic clamp 4, the supporting portion 20 can be considered as being grounded. It will be appreciated that in other embodiments, the supporting portion of the cleaning apparatus may be connected to ground.

In embodiments in which the supporting portion 20 comprises a plurality of recesses 20b, 20c, the insulating portion 18 may be arranged to extend between two adjacent recesses of the support portion.

A lateral extension or dimension of the cleaning apparatus 16, for example in the y-direction and/or z-direction indicated in FIG. 2, may be selected dependent on a lateral extension or dimension of the electrostatic clamp 4, for example in the y-direction and/or z-directed indicated in FIG. 2. For example, the lateral extension or dimension of the cleaning apparatus 16 may be selected to correspond (or substantially correspond) to the lateral extension or dimension of the electrostatic clamp 4. This may allow for removal of particles from nearly all of the upper surface 6a of the dielectric portion 6 of the electrostatic clamp 4. However, it will be appreciated that it may be desirable to remove the particles from pre-determined areas or spaces on the upper surface of the electrostatic clamp.

Figure 4A:
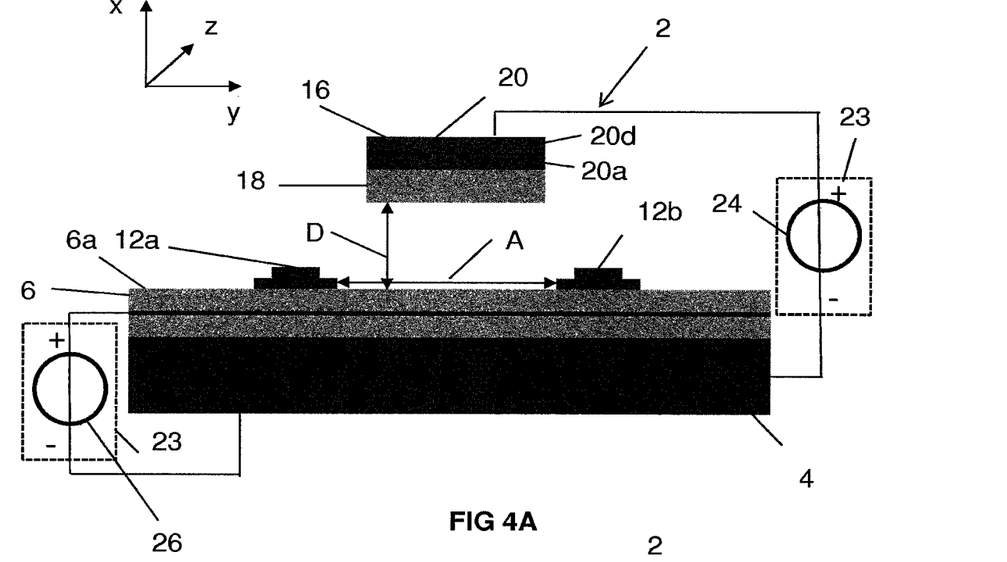
FIG. 4A schematically depicts a system comprising an apparatus for removing particles from a clamp according to some embodiments of the disclosure.

FIG. 4A depicts another example of a system 2 for removing particles from a clamp. The system 2 depicted in FIG. 4A is similar to that depicted in FIG. 2. However, the supporting portion 20 and insulating portion 18 are arranged to each define a continuous surface. It will be appreciated that in other examples one of the supporting portion or the insulating portion may define a continuous surface, while the other comprises one or more recesses. The lateral extension or dimension of the cleaning apparatus 16, for example in the y-direction and z-direction indicated in FIG. 4A is less than the lateral extension or dimension of the cleaning apparatus depicted in FIG. 2. The lateral extension or dimension of the cleaning apparatus 16 may be selected such that the particles may be removed or removable from a pre-determined area or space on the upper surface 6a of the dielectric portion of the electrostatic clamp 4. For example, the lateral extension or dimension of the cleaning apparatus 16 may be selected to correspond (or substantially correspond) to or less than a space or area between two adjacent burls 12a, 12b of the electrostatic clamp 4. This may allow the distance D between the cleaning apparatus 16 and the electrostatic clamp to be reduced or minimised, e.g. to increase a strength of the electric field between the cleaning apparatus 16 and the electrostatic clamp 4. This may also allow particles to be removed locally from the upper surface 6a of the dielectric portion 6 of the electrostatic clamp 4. Although the cleaning apparatus 16 is depicted in FIG. 4A as comprising a lateral extension or dimension that is less than the lateral extension or dimension of the electrostatic clamp, it will be appreciated that in other embodiments the lateral extension or dimension of the cleaning apparatus may be selected to substantially correspond to the lateral extension or dimension of the electrostatic clamp.

Figure 4B:
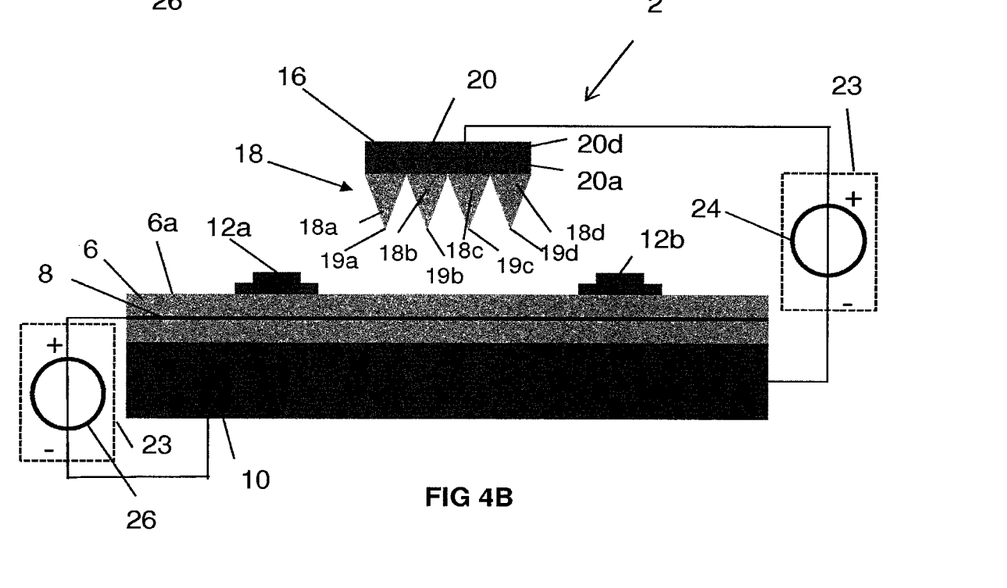
FIG. 4B schematically depicts a system comprising an apparatus for removing particles from a clamp according to some embodiments of the disclosure.

FIG. 4B depicts another example of a system for removing particles from a clamp. The system 2 depicted in FIG. 4A is similar to that depicted in FIG. 2. The insulating portion 18 of the cleaning apparatus 16 may be shaped such that the electric field generated between the cleaning apparatus 16 and the electrostatic clamp 4 comprises an inhomogeneous electric field. The insulating portion 18 may be shaped such an electric field generated between the cleaning apparatus 16 and the electrostatic clamp 4 is concentrated or increased at one or more points on the insulating portion 18. For example, the cleaning apparatus 16 may comprise a plurality of insulating portions 18a, 18b, 18c, 18d, which may be arranged to extend from the electrode 20. Each insulating portion 18a, 18b, 18c, 18d may be arranged to taper from a first end to a second end. The first end of each insulating portion 18a, 18b, 18c, 18d may be arranged at or on the supporting portion 20. The second end may be arranged to be distal from the supporting portion 20. The second end may be arranged such that, in use, the second end is directed towards the upper surface 6a of the dielectric portion 6 of the electrostatic clamp 4.

Each insulating portion 18a, 18b, 18c, 18d may comprise a pointed or sharp portion 19a, 19b, 19c, 19d. The pointed or sharp portion 19a, 19b, 19c, 19d may be part of, comprised in or define the second end of each insulating portion 18a, 18b, 18c, 18d. The plurality of insulating portions 18a, 18b, 18c, 18d may be arranged on the supporting portion 20 such that, in use, each pointed or sharp portion 19a, 19b, 19c, 19d of each insulating portion 18a, 18b, 18c, 18d is directed towards the upper surface 6a of the dielectric portion 6 of the electrostatic clamp 4. When an electric field is generated between the cleaning apparatus 16 and the electrostatic clamp 4, the electric field may be considered as being concentrated on the pointed or sharp portions 19a-19d of each insulating portion 18a-18d. In other words, the strength of the generated electric field may be considered to be increased at the pointed or sharp portions 19a-19d of each insulating portion 18a-18d. This may allow for the removal of particles from the upper surface 6a of the dielectric portion 6 of the electrostatic clamp 4, as described above.

The electric field generated between the cleaning apparatus 16 depicted in FIG. 4B may be considered to be inhomogeneous. The generation of an inhomogeneous electric field between the cleaning apparatus 16 and the electrostatic clamp 4 may allow for the removal of non-charged particles. For example, in use, non-charged particles may be attracted by the electric field generated between the electrostatic clamp 4 and the object. In some examples, a non-charged particle may become polarized by the electric field generated between the electrostatic clamp 4 and the object. For example, two opposite charges may be induced in the particle by the electric field between the electrostatic clamp 4 and the object. A part of the particle may become positively charged and another part of the particle may become negatively charged. This may result in the particle becoming aligned with the electric field. In a homogenous electric field the particle may be stationary or non-moving on the electrostatic clamp 4, e.g. due to Coulomb forces acting on both parts of the particle, while in an inhomogeneous electric field the particle may be attracted to a part of the electric field, which has an increased electric field strength. In other examples, a particle comprising a charge, such as for example a pre-charged particle, may be present or placed between the electrostatic clamp 4 and the object. The particle may move towards the electrostatic clamp 4, e.g. due to Coulomb forces acting on the particle. The effect of two opposite charges being induced in a non-charged particle may be considered to be generally weaker than the effect of a pre-charged particle moving towards the electrostatic clamp 4, e.g. due to Coulomb forces acting on the particle.

The insulating portions 18a-18d may be provided in the form of teeth or prongs extending from the supporting portion 20 of the cleaning apparatus. It should be understood that the insulating portions are not limited to being provided in the form of teeth or prongs and that other shapes of the insulating portions may be used to concentrate the generated electric field at one or more points of the insulating portion and/or generate an inhomogeneous electric field. Although FIG. 4B depicts four insulating portions, it will be appreciated that in other embodiments more or less than four insulating portions may be arranged on the electrode of the cleaning apparatus.

In FIGS. 4A and 4B, a voltage may be applied to the supporting portion 20, such as for example to an upper part 20d of the supporting portion 20. A polarity of the voltage applied to the supporting portion 20 may be the same. The voltage applied to supporting portion 20 may cause a redistribution of charge in the supporting portion 20, e.g. when no voltage is applied to the electrode 8 of the electrostatic clamp 4. When a voltage is applied to the supporting portion 20 of the cleaning apparatus 16 and to the electrode 8 of the electrostatic clamp, the redistribution of charges in the supporting portion 20 may be increased. This may lead to an increased strength of the electric field extending between the cleaning apparatus 16 and the electrostatic clamp 4. For example, when a positive voltage is applied to the supporting portion 20 of the cleaning apparatus 16 and/or the electrode 8 of the electrostatic clamp 4, the lower part 20a of the supporting portion 20 may be considered to be negatively charged and an upper part 20d of the supporting portion 20 may be considered to be positively charged. It will be appreciated that in embodiments where a negative voltage is applied to the supporting portion of the cleaning apparatus and/or the electrode of the electrostatic clamp, the lower part of the supporting portion may be considered to be positively charged and the upper part of the supporting portion may be considered to be negatively charged.

The systems 2 depicted in FIGS. 2, 4A and/or 4B may comprise a controller 23 (indicated by the dashed rectangular in FIGS. 2, 4A and 4B). The controller 23 may be configured to apply a voltage to the electrode 8 of the electrostatic clamp 4 and/or the supporting portion 20 of the cleaning apparatus 16. The controller 23 may comprise a voltage source 24. The voltage source 24 may be configured to apply the voltage to the supporting portion 20 of the cleaning apparatus 16. The system 2 may comprise a further voltage source 26 configured to supply a voltage to the electrostatic clamp 4. The further voltage source 26 may be part of or comprised in the controller 23. Alternatively, the further voltage source 26 may be part of or comprised in a further controller. Alternatively, the voltage source 24 may be configured to apply a voltage to the supporting portion 20 of the cleaning apparatus 16 and the electrode 8 of the electrostatic clamp 4. It will be appreciated that in other embodiments the controller (or further controller) may be provided separate from and/or in addition to the controller (or further controller).

The insulating portion 18 depicted in FIGS. 2, 4A and/or 4B may comprise a minimum thickness. The minimum thickness of the insulating portion may be such that breakdown of the insulating portion 18 is prevented. The insulating portion 18 may comprise a maximum thickness. The maximum thickness may be selected such a strength of the electric field generated between the cleaning apparatus 16 and the electrostatic clamp 4 is maximised. For example, a thickness of the insulating portion 18 that is larger than the maximum thickness may cause a reduction of the strength of the electric field compared to a strength of an electric field generated between a cleaning apparatus 16, comprising in insulating portion with a thickness equal to or below the maximum thickness, and the electrostatic clamp 4. The thickness of the insulating portion 18 may be selected to be less than the distance D between the cleaning apparatus 16 and the electrostatic clamp 4, e.g. during operation of the cleaning apparatus 16. The thickness of the insulating portion 18 may be selected to be in the range of about 100 nm to 5 µm.

The supporting portion 20 depicted in FIGS. 2, 4A and/or 4B may comprise a material selected such that a time constant of the material is smaller than a time used for removing particles from the electrostatic clamp 4. The time constant of the material may be considered as a response of the material to the electric field generated between the cleaning apparatus 16 and the electrostatic clamp 4. In other words, the time constant of the material may be considered as a time needed for the material to become at least partly or fully polarized, e.g. a time need for charges in the material to redistribute, as described above. The time constant of the material may result from the product of a resistivity of the material and a permittivity of the material. The material may be selected such that the time constant is in a range of less than a second to more than a day. For example, the material may comprise a time constant of equal to or less than 0.1 seconds. This may allow the material of the supporting portion 20 to be considered to be conductive. For example, the supporting portion depicted in FIGS. 2, 4A and/or 4B may comprise a conducting material, such as for example a metal, or a semiconductor material, e.g. Silicon, Gallium Nitride (GaN) or Silicon Carbide (SiC).

In use, the cleaning apparatus 16 depicted in FIGS. 2, 4A and/or 4B may be arranged in proximity to the upper surface 6a of the electrostatic clamp 4. For example, the cleaning apparatus 16 may be arranged relative to the electrostatic clamp 4 such that the insulating portion 18 is directed or extends towards the electrostatic clamp 4, e.g. the upper surface 6a of the dielectric portion 6. The cleaning apparatus 16 may be arranged relative to the electrostatic clamp such that the insulating portion 18 and/or the supporting portion 20 extends in a direction parallel (or substantially parallel) to the upper surface 6a of the dielectric portion 6 of the electrostatic clamp 4.

In use, a voltage may be applied to the electrode 8 of the electrostatic clamp 4 and/or the supporting portion 20 of the cleaning apparatus 16 to generate an electric field between the cleaning apparatus 16 and the electrostatic clamp 4. The voltage may selected such that an electric field generated between the cleaning apparatus 16 and the electrostatic clamp 4 acts on the particles to cause removal of the particles from the upper surface 6a of the electrostatic clamp 4.

The system 2 and/or cleaning apparatus 16 may be part of the lithographic apparatus. However, it will be appreciated that in other embodiments, the system and/or cleaning apparatus may be provided separately from the lithographic apparatus. For example, the system and/or cleaning apparatus may be part or comprised in a separate cleaning station. The system and/or apparatus may be used to prevent particles from moving or being transported towards the electrostatic clamp 4 or other objects. This may prevent particles from entering the lithographic apparatus or reduced the amount of particles that may enter the lithographic apparatus. For example, the system and/or apparatus may be part of a substrate loading system.

The supporting portion was described as being configured to act as an electrode when a voltage is applied to the electrode of the electrostatic clamp and/or the supporting portion. As described above, the supporting portion may comprise a semiconductor material. In this example, the supporting portion may be considered as acting as an electrode when the supporting portion is arranged in or experiences an electric field generated by the electrostatic clamp, e.g. the voltage applied to the electrode of the electrostatic clamp, or a voltage. Alternatively, the supporting portion may be considered as acting as an electrode when a voltage is applied to the supporting portion, which may cause a redistribution of charges in the supporting portion, as described above. It will be appreciated that in other embodiments, the supporting portion may comprise a conducting material in addition to or instead of the semiconductor material. The supporting portion may act as an electrode, when a voltage is applied to the conducting material. For example, conducting material may be arranged to form the electrode in the supporting portion. In such embodiments, the voltage, e.g. the polarity of the voltage; that is applied to the electrode of the electrostatic clamp and/or the supporting portion may be selected such that an electric field generated between the cleaning apparatus and the electrostatic clamp acts on the particles to cause removal of the particles from the upper surface of the electrostatic clamp.

Particles on an electrostatic clamp can be pre-charged to facilitate improved removal from the electrostatic clamp by means of electrostatic forces. Such pre-charging may be done as follows: first, a clamping voltage of e.g. plus 200 Volts (it should be less than plus or minus 300 Volts) is applied to the electrostatic clamp without an object being present on the clamp. During application of this clamping voltage the electrostatic clamp and the particles thereon are discharged by means of exposure with (EUV) radiation. Then, the clamping voltage is removed and the particles are pre-charged with minus 200 Volts (with plus 200 Volts if the clamping voltage was minus 200 Volts).

Embodiments of the disclosure may be used in lithographic apparatus which use EUV radiation or Deep Ultra Violet (DUV) radiation (e.g. 193 nm or 248 nm). Electrostatic clamps may be used in lithographic apparatus LA in which it is not practical to use a vacuum clamp. For example, some regions of a EUV lithographic apparatus LA operate under vacuum conditions, and consequently it may not be practical to use a vacuum clamp in those regions. An electrostatic clamp may be used instead. When using DUV radiation, the lithographic apparatus may be under ambient (non-vacuum conditions) and so a vacuum clamp may be used to hold the substrate W to the substrate table WT. Embodiments of the invention may be used to remove contamination from substrate tables WT which comprise a vacuum clamp.

Figure 5A:
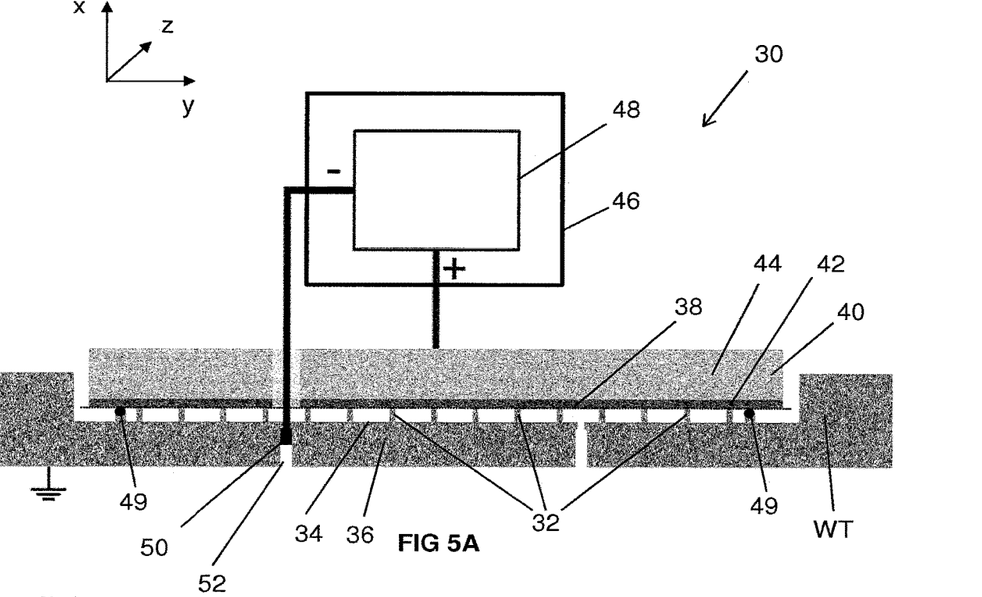
FIG. 5A schematically depicts a system comprising an apparatus for removing particles from a substrate table according to some embodiments of the disclosure.

FIG. 5A depicts a system 30 for removing particles from a substrate table WT according to some embodiments of the disclosure. The substrate table WT may comprise a plurality of supports, which in this example are burls 32, for holding a substrate W (not shown). The burls 32 are provided as a two dimensional array. Fifteen burls 32 are visible in FIG. 5A. This may correspond with a two dimensional array of around 150 burls. It will be appreciated that in other examples, the substrate table WT may comprise other numbers of burls. The burls 32 are arranged on an upper surface 34 of a main body 36 of the substrate table WT. The burls 32 may be integral with the main body 36 of the substrate table WT. Upper surfaces of the burls 32 may define a plane 38 in which the substrate W can be held.

The substrate W may be attached to the burls 32 by a vacuum clamp. That is, the substrate W is held to the burls 32 by applying a vacuum that provides a force attracting the substrate W to the burls 32. To this end, seals 49 are provided on the substrate table WT. It will be appreciated that the system described herein is not limited to using a vacuum clamp and other clamps may be used.

FIG. 5A depicts an apparatus for use with the system 30 for removing particles from a substrate table WT. The apparatus may be provided in the form of a cleaning apparatus 40. The cleaning apparatus 40 depicted in FIG. 5A may also be referred to as a cleaning substrate. The cleaning apparatus 40 may be suitable for removing particles from the substrate table WT. In particular, the cleaning apparatus 40 may be suitable for removing particles from the burls 32 of the substrate table WT. Even more particularly, the cleaning apparatus 40 may be suitable for removing particles from top surfaces of the burls 32 of the substrate table WT.

In use, the cleaning apparatus 40 may be arranged in proximity of the substrate table WT. The cleaning apparatus 40 comprises an insulating portion 42. The insulating portion 42 may comprise an insulating or dielectric material, such as for example glass or a polymer. The insulating portion 42 may comprise photoresist.

The cleaning apparatus 40 comprises a supporting portion 44. The supporting portion 44 may be a substrate W. The supporting portion 44 may be a conductive plate, more particularly a bare substrate W. In FIG. 5A, the insulating portion 42 is depicted as being arranged on the supporting portion 44. The insulating portion 42 is arranged to extend or protrude from the supporting portion 44.

The supporting portion 44 and insulating portion 42 are arranged to each define a substantially continuous surface, except for a portion of one or both of the supporting portion 44 and the insulating portion 42 where an electrical connection may pass. In other examples, there may not be portions for electrical connections to pass and the supporting portion and/or insulating portion may define a wholly continuous surface. It will be appreciated that in other examples one of the supporting portion or the insulating portion may define a continuous surface, while the other comprises one or more recesses.

The supporting portion 40 is configured such that when a voltage is applied to the supporting portion 44 and/or the substrate table WT, the supporting portion 44 acts as an electrode to allow an electric field to be generated between the cleaning apparatus 40 and the substrate table WT for removal of the particles from the substrate table WT. Thus, there is a voltage difference across the non-conductive insulating portion 42. The voltage applied to the supporting portion 44 and/or the substrate table WT may be selected such that the particles adhere to at least a part or all of the insulating portion 38 of the cleaning apparatus 40.

The system 30 may comprise a controller 46 (indicated by a rectangle in FIG. 5A). In this example, the controller 46 may be configured to apply a voltage to the supporting portion 44 of the cleaning apparatus 40. The controller 46 may comprise a voltage source 48. The voltage source may be DC. The voltage source 48 may be configured to apply the voltage to the supporting portion 11 of the cleaning apparatus 40. A negative polarity of the DC voltage source 48 may be connected to the substrate table WT. This may be achieved by attaching a rod 50 in a hole 52 in the substrate table WT. The electrical connection between the negative polarity of the DC voltage source 48 to the rod 50 may pass through portions of one or both of the supporting portion 44 and the insulating portion 42. The substrate table WT may be grounded. In other examples, the negative polarity of the DC voltage source 48 may be connected to the same grounding as the substrate table WT.

In other examples, the system 30 may comprise a further voltage source (not shown) configured to supply a voltage to the substrate table WT. The further voltage source may be part of or comprised in the controller 46. Alternatively, the further voltage source may be part of or comprised in a further controller (not shown). Alternatively, the voltage source 48 may be configured to apply a voltage to the supporting portion 44 of the cleaning apparatus 40 and the substrate table WT.

Due to the electric field set up between the cleaning apparatus 40 and the substrate table WT, the particles on the substrate table WT may acquire a charge. If the electric field is strong enough, the electrostatic attraction from the supporting portion 44 can overcome the adhesion (and gravity forces) acting on the particle and the particle can become attached to the insulating portion 42. This is similar to the method described above in relation to FIGS. 2 to 4.

Depending on the particle diameter and the size of the electric field, one of the forces gravity, adhesion or electrostatic force can be dominant on the particle. In one example, for particle removal for a particle diameter of 200-300 nm, if an electric field of 1 MW/cm is applied then the resulting electrostatic force can overcome gravity and adhesion. Electric fields of other magnitudes may be used. The electric field may be increased for particle removal of decreasing particle sizes. That is, for a smaller particle, the electric field must be larger for the electrostatic force to be dominant on the smaller particle than for a larger particle.

The insulating portion 42 may have a thickness (i.e. in the x direction) of approximately 1-10 μm. In other examples, the thickness of the insulating portion 42 may be less or more than this depending on the requirements.

The cleaning apparatus of FIG. 5A may achieve electric fields of up to 10 MW/cm. For example, to achieve a 10 MW/cm electric field, a voltage difference of 10 kV may be applied for a 10 nm insulating layer 42. In other examples, the electric fields achieved may be different from 10 MW/cm.

The system 30 cleans the top surface of the burls 30 by removing particles that build up there. Other previous methods of cleaning the substrate table WT do not clean the substrate table WT adequately.

Previous cleaning procedures/tools/liquids are believed to be insufficient to properly clean a contaminated substrate table WT. Manual cleaning is performed when a certain contamination threshold is reached. Previously, before the manual cleaning contamination threshold was reached an in-situ granite cleaning stone was used to clean the substrate table WT. This in-situ cleaning is more time-efficient (order of minutes) than manual cleaning (4 hours), but is less thorough.

Using previous methods of cleaning, it has been noted that there has been an increase in required cleaning frequency over time from a new substrate table WT being used. This is due to the previous cleaning methods (both in-situ and manual) not cleaning the substrate table WT thoroughly. More particularly, this is because the only surface that is actively cleaned is the burl top area, because the cleaning stone (which is also used during manual cleaning) does not reach below the burl top plane. The contamination (particles) may be not removed using these previous methods, rather they may just be displaced, e.g. to in between the burls. When contamination is not removed but displaced, the chance of contaminating the burl tops after cleaning becomes larger. This burl top contamination then leads to focus spots (substrate W plane deviations in z-direction), which leads to substrate W yield loss.

When particles are not removed, the particles have an opportunity to become attached to the substrate table WT surface. For example, silicon particles may settle and oxidize on the substrate table WT surface.

The system 30 of FIG. 5A provides improved cleaning to reduce contamination build up. The particles may be removed by the system 30. Contamination build up on the edge up the substrate table WT negatively impacts substrate edge yield and machine up-time of a lithographic apparatus LA. Therefore removing the contamination (the particles) using the system 30 of FIG. 5A may avoid a reduction in substrate edge yield and may lead to an increased availability of the lithographic apparatus.

The system 30 may work particularly well on hard particles (such as SiC grains or Si particles) adhered to the top surface of the burls 30.

Figure 5B:
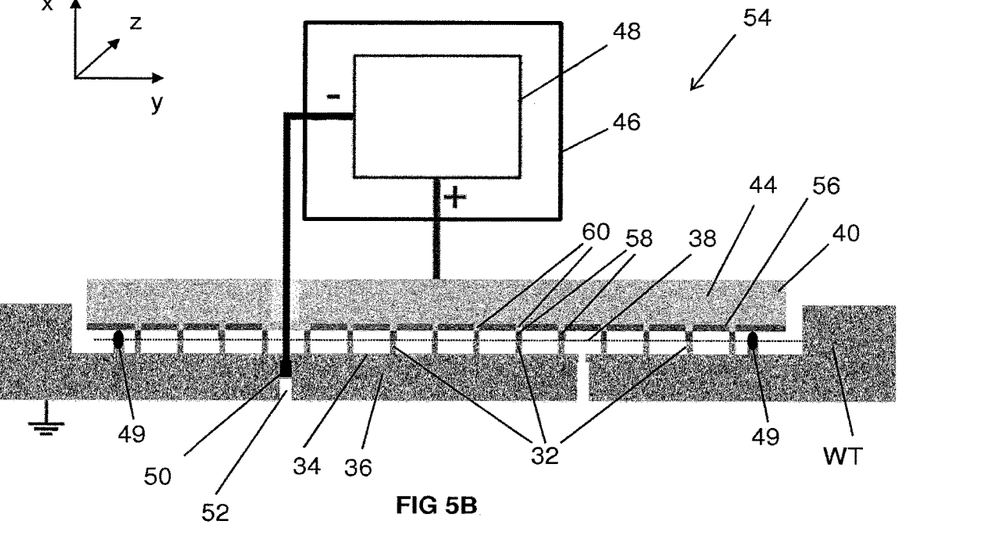
FIG. 5B schematically depicts a system comprising an apparatus for removing particles from a substrate table according to some embodiments of the disclosure.

FIG. 5B depicts another example of a system 54 for removing particles from a substrate table WT, This system 54 is the same as the system 30 of FIG. 5A except that insulating portion 56 does not define a substantially continuous surface.

The insulating portion 56 has projecting portions 58 which protrude towards the substrate table WT from the supporting portion 44 (the x direction) in the region of the burls 32 of the substrate table WT. Recesses are formed in the insulating portion 56 as a consequence of the projecting portions 58 projecting towards the substrate table WT. The projecting portions 58 have a size (width) in the y direction substantially the same as the size (width) of the burls 32 in the y direction, although some of the projecting portions 58 may overlap the burls 32 slightly. The projecting portions 58 have a size (length) in the z direction substantially the same as the size (length) of the burls 32 in the z direction, although some of the projecting portions 58 may overlap the burls 32 slightly. In general, the area of the projecting portions 58 is the same or similar size to the area of the top surface of the burls 32.

The supporting portion 44 also has projecting portions 60 which protrude towards the substrate table WT from the supporting portion 44 (the x direction) in the region of the burls 32 of the substrate table WT. These projecting portions 60 fill the recesses formed in the insulating portion 56 as a consequence of the projecting portions 58 projecting towards the substrate table WT. Thus, the supporting portion 44 is still the same distance (i.e. the thickness of the insulating portion 56 in the x direction) from the top surface of the burls 32.

The new shape of the insulating portion 56 due to the projecting portions 58 reduces the chance of arcing (ionization of the air) between the insulating portion 56 and the main body 36 of the substrate table WT. This is due to the increased distance between the non-protruding portion of the insulating portion 56 and the main body 36 of the substrate table WT. Arcing in air typically becomes an issue with an electric field of at least 0.03 MW/cm. When applying a 1 MW/cm electric field across the insulating portion 56, the electric field towards the main body 36 of the substrate table WT can be 0.03 MW/cm. Reducing the thickness of the insulating portions may decrease the risk of arcing. In other examples, the risk of arcing may be reduced in other ways, for example by increasing the distance between the insulating portion 56 and the main body 36 of the substrate table WT.

Although specific reference may be made in this text to embodiments of the disclosure in the context of a lithographic apparatus, embodiments of the disclosure may be used in other apparatuses. Embodiments of the present disclosure may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the disclosure in the context of optical lithography, it will be appreciated that these embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the disclosure have been described above, it will be appreciated that these embodiments may be practiced otherwise than as described. The descriptions above are intended to be illustrative, not limiting. Thus it will be apparent to one skilled in the art that modifications may be made to the embodiments as described without departing from the scope of the claims set out below.

The invention claimed is:

1. An apparatus for removing particles from a clamp, the apparatus being arrangeable in proximity of the clamp and comprising:
an insulating portion;
a supporting portion, at least a part or all of the insulating portion being arranged on the supporting portion, wherein the supporting portion is configured such that when a voltage is applied to the supporting portion of the apparatus and/or to an electrode of the clamp, the supporting portion acts as an electrode to allow an electric field to be generated between the apparatus and the clamp for removal of the particles from the clamp, and wherein the supporting portion comprises a plurality of recesses, wherein the insulating portion extends between at least two adjacent recesses.

2. The apparatus of claim 1, wherein the apparatus is configured such that a shape of at least a portion of the apparatus is complementary to a shape of a portion of the clamp to allow a distance between the apparatus and the clamp to be reduced or minimised.

3. The apparatus of claim 1, each recess of the plurality of recesses is shaped such that a support of the clamp is at least partially receivable in each recess of the plurality of recesses, when the apparatus is moved towards the clamp.

4. The apparatus of claim 1, wherein the insulating portion is shaped or configured such that an inhomogeneous electric field is generated between the apparatus and the clamp, when a voltage is applied to the supporting portion of the apparatus and/or the electrode of the clamp.

5. The apparatus of claim 1, wherein the insulating portion is shaped or configured such that at least a part of an electric field generated between the apparatus and the clamp is concentrated or increased at one or more points on the insulating portion, when a voltage is applied to the supporting portion of the apparatus and/or the electrode of the clamp.

6. The apparatus of claim 1, wherein apparatus comprises a plurality of insulating portions, each insulating portion being arranged to extend or protrude from the supporting portion.

7. The apparatus of claim 6, wherein the/each insulating portion is arranged to taper from a first end to a second end, the first end of the/each insulating portion being arranged at or on the supporting portion, the second end being arranged such that, in use, the second end is directed towards the clamp.

8. The apparatus of claim 7, wherein the second end of the/each insulating portion comprises a pointed or sharp portion.

9. The apparatus of claim 1, wherein a lateral extension or dimension of the apparatus is selected to substantially correspond to a lateral extension or dimension of the clamp.

10. The apparatus of claim 1, wherein a lateral extension or dimension of the apparatus is selected such that the particles are removed or removeable from a pre-determined area or space on the clamp.

11. The apparatus of claim 1, wherein the apparatus is configured to be connected or connectable to a controller, the controller being configured to apply a voltage to the supporting portion of the apparatus and/or the electrode of the clamp.

12. The apparatus of claim 1, wherein the supporting portion and/or the insulating portion are arranged to define a continuous surface.

13. The apparatus of claim 1, wherein when a voltage is applied to the supporting portion of the apparatus and/or an electrode of the clamp, the voltage is selected such that the electric field between the apparatus and the clamp extends in a direction opposite to a direction of an electric field generated between the clamp and an object in use of the clamp.

14. A system for removing particles from a clamp, the system comprising
an apparatus of claim 1; and
a clamp configured to hold an object.

15. The system of claim 14, wherein the clamp is configured for use with a lithographic apparatus or the clamp is part of or comprised in the lithographic apparatus.

16. The system of claim 14, wherein the clamp comprises an electrostatic clamp.

17. The system of claim 14, further comprising a controller configured to apply a voltage to the supporting portion of the apparatus and/or an electrode of the clamp, wherein the voltage is selected such that the electric field generated between the apparatus and the clamp acts on the particles on the clamp to cause removal of the particles from the clamp.

18. A lithographic apparatus comprising:
an illumination system configured to condition a radiation beam;
a support structure constructed to support a patterning device, the patterning device being capable of imparting the radiation beam with a pattern in its cross-section to form a patterned radiation beam;
a substrate table constructed to hold a substrate, the substrate table comprising a clamp for holding the substrate;
a projection system configured to project the patterned radiation beam onto the substrate; and
an apparatus for removing particles from the clamp according to claim 1.

19. A lithographic apparatus comprising:
an illumination system configured to condition a radiation beam;
a support structure constructed to support a patterning device, the support structure comprising a clamp for holding the patterning device, the patterning device being capable of imparting the radiation beam with a pattern in its cross-section to form a patterned radiation beam;
a substrate table constructed to hold a substrate;
a projection system configured to project the patterned radiation beam onto the substrate; and
an apparatus for removing particles from the clamp according to claim 1.

20. Method of removing particles from a clamp, the method comprising:
- arranging an apparatus for removing particles from a clamp in proximity of the clamp, the apparatus comprising an insulating portion and a supporting portion, wherein at least a part or all of the insulating portion is arranged on the supporting portion, wherein the supporting portion is configured such that when a voltage is applied to the supporting portion of the apparatus and/or to an electrode of the clamp, the supporting portion acts as an electrode to allow an electric field to be generated between the apparatus and the clamp for removal of the particles from the clamp, and wherein the supporting portion comprises a plurality of recesses, wherein the insulating portion extends between at least two adjacent recesses; and
- applying a voltage to the supporting portion of the apparatus and/or an electrode of the clamp to generate an electric field between the apparatus and the clamp for removal of the particles from the clamp.

21. The method of claim 20, wherein the voltage is selected such that the particles adhere to at least a part or all of the insulating portion.

22. The method of claim 20, wherein the particles on the clamp are pre-charged before removing them from the clamp.

23. An apparatus for removing particles from a substrate table, the apparatus being arrangeable in proximity of the substrate table and comprising:
- an insulating portion;
- a supporting portion, at least a part or all of the insulating portion being arranged on the supporting portion, wherein the supporting portion is configured such that when a voltage is applied to the supporting portion of the apparatus and/or to the substrate table, the supporting portion acts as an electrode to allow an electric field to be generated between the apparatus and the substrate table for removal of the particles from the substrate table, and wherein the supporting portion comprises a plurality of recesses, wherein the insulating portion extends between at least two adjacent recesses.

24. The apparatus of claim 23, wherein the apparatus is configured to remove particles from the top surface of burls of the substrate table.

25. The apparatus of claim 24, wherein the insulating portion and the supporting portion have projecting portions in the region of the burls.

26. The apparatus of claim 23, wherein the supporting portion and/or the insulating portion are arranged to define a continuous surface.

27. The apparatus of claim 23, wherein the supporting portion is a conductive plate.

28. The apparatus of claim 23, wherein the insulating portion is a layer of polymer.

29. The apparatus of claim 23, wherein the apparatus is configured to be connected or connectable to a controller, the controller being configured to apply a voltage to the supporting portion of the apparatus and/or the substrate table.

30. A system for removing particles from a substrate table, the system comprising
- an apparatus according to claim 23; and
- a substrate table constructed to hold a substrate.

31. The system of claim 30, wherein the substrate table is configured for use with a lithographic apparatus or the substrate table is part of or comprised in the lithographic apparatus.

32. The system of claim 30, further comprising a controller configured to apply a voltage to the supporting portion of the apparatus and/or the substrate table, wherein the voltage is selected such that the electric field generated between the apparatus and the substrate table acts on the particles on the substrate table to cause removal of the particles from the substrate table.

33. A lithographic apparatus comprising:
- an illumination system configured to condition a radiation beam;
- a support structure constructed to support a patterning device, the patterning device being capable of imparting the radiation beam with a pattern in its cross-section to form a patterned radiation beam;
- a substrate table constructed to hold a substrate;
- a projection system configured to project the patterned radiation beam onto the substrate; and
- an apparatus for removing particles from the substrate table according to claim 23.

34. A method of removing particles from a substrate table, the method comprising:
- arranging an apparatus for removing particles from a substrate table in proximity of the substrate table, the apparatus comprising an insulating portion and a supporting portion, wherein at least a part or all of the insulating portion is arranged on the supporting portion, wherein the supporting portion is configured such that when a voltage is applied to the supporting portion of the apparatus and/or to the substrate table, the supporting portion acts as an electrode to allow an electric field to be generated between the apparatus and the substrate table for removal of the particles from the substrate table, and wherein the supporting portion comprises a plurality of recesses, wherein the insulating portion extends between at least two adjacent recesses; and
- applying a voltage to the supporting portion of the apparatus and/or the substrate table to generate an electric field between the apparatus and the substrate table for removal of the particles from the substrate table.

35. The method of claim 34, wherein the voltage is selected such that the particles adhere to at least a part or all of the insulating portion.

* * * * *